(12) United States Patent
Chien et al.

(10) Patent No.: US 11,044,803 B2
(45) Date of Patent: Jun. 22, 2021

(54) FLEXIBLE CIRCUIT BOARD

(71) Applicant: Advanced Connectek Inc., New Taipei (TW)

(72) Inventors: Min-Lung Chien, New Taipei (TW); Ta-Teh Meng, New Taipei (TW); Mao-Sheng Chen, New Taipei (TW); Wen-Yu Wang, New Taipei (TW)

(73) Assignee: Advanced Connectek Inc., New Taipei (TW)

( * ) Notice: Subject to any disclaimer, the term of this patent is extended or adjusted under 35 U.S.C. 154(b) by 0 days.

(21) Appl. No.: 16/908,740

(22) Filed: Jun. 23, 2020

(65) Prior Publication Data
US 2020/0413527 A1 Dec. 31, 2020

(30) Foreign Application Priority Data
Jun. 28, 2019 (TW) .................................. 108122900

(51) Int. Cl.
*H05K 1/02* (2006.01)

(52) U.S. Cl.
CPC .......... *H05K 1/024* (2013.01); *H05K 1/0219* (2013.01); *H05K 1/0225* (2013.01); *H05K 1/0277* (2013.01); *H05K 2201/0141* (2013.01); *H05K 2201/0154* (2013.01); *H05K 2201/0191* (2013.01); *H05K 2201/0715* (2013.01)

(58) Field of Classification Search
CPC ...... H05K 1/0353–0373; H05K 1/0277–0283; H05K 1/028
See application file for complete search history.

(56) References Cited

U.S. PATENT DOCUMENTS

| | | | |
|---|---|---|---|
| 2015/0257253 A1* | 9/2015 | Lee ......................... | H05K 3/007 428/40.9 |
| 2020/0015351 A1* | 1/2020 | Takano ................... | H01P 3/085 |

FOREIGN PATENT DOCUMENTS

| | | |
|---|---|---|
| TW | I364365 | 5/2012 |
| TW | M550960 | 10/2017 |
| TW | M556457 | 3/2018 |

* cited by examiner

*Primary Examiner* — Jeremy C Norris
(74) *Attorney, Agent, or Firm* — JCIPRNET

(57) ABSTRACT

A flexible circuit board including at least two electrical conducting layers, at least two non-electrical conducting layers, and at least one adhesion layer is provided. The non-electrical conducting layers are disposed between the electrical conducting layers. The non-electrical conducting layers are adhered together via the adhesion layer. A sum of thickness of the non-electrical conducting layers is greater than 4 mil, and there is no electrical conducting layer sandwiched between the at least two non-electrical conducting layers.

10 Claims, 20 Drawing Sheets

FLEXIBLE CIRCUIT BOARD

CROSS-REFERENCE TO RELATED APPLICATION

This application claims the priority benefit of Taiwan patent application serial no. 108122900, filed on Jun. 28, 2019. The entirety of the above-mentioned patent application is hereby incorporated by reference herein and made a part of the specification.

BACKGROUNDING

1. Technical Field

The present disclosure relates to a circuit board, and more particularly to a flexible circuit board.

2. Description of Related Art

In the past, flexible circuit boards having a multilayer structure were mostly used at an operating frequency lower than 1 GHz. However, in recent years, with the increase in the amount of data processed by electronic machinery, the data processing capability has been improved by miniaturization and integration of the system, and electronic products capable of high-speed data processing have been developed. However, material and structural limitations, as well as electromagnetic interference (EMI), radio frequency interference (RFI) and impedance requirements, etc. will affect the layout of the flexible circuit board and its transmission efficiency.

For example, in response to the transmission requirements of high-speed signals, the thickness of the insulating layer (or dielectric layer) needs to be correspondingly increased to reduce the loss during signal transmission. However, due to the material characteristics of existing products, it cannot freely increase without restriction.

In other words, as the application products are different, the impedance and signal characteristics will change accordingly. How to meet the above requirements under the conditions of existing materials and structures is a subject that the relevant technical personnel need to think about and solve.

SUMMARY

The present disclosure provides a flexible circuit board, in which at least two non-electrical conducting layers are optionally adhered via an adhesion layer and a sum of thickness of them is greater than 4 mil such that the flexible circuit board can meet the signal integrity (SI) during the signal transmission.

The flexible circuit board of the present disclosure includes at least two electrical conducting layers, at least two non-electrical conducting layers, and at least one adhesion layer. The non-electrical conducting layers are disposed between the electrical conducting layers. The non-electrical conducting layers are adhered together via the adhesion layer. A sum of thickness of the non-electrical conducting layers is greater than 4 mil, and there is no electrical conducting layer sandwiched between the at least two non-electrical conducting layers.

In an embodiment of the present disclosure, the non-electrical conducting layers include at least one material.

In an embodiment of the present disclosure, the non-electrical conducting layers include at least one of polyimide (PI), modified polyimide (modified PI), polyimide stiffener (PI stiffener) and liquid crystal polymer (LCP).

In an embodiment of the present disclosure, the electrical conducting layer and the non-electrical conducting layer located on the same side of the adhesive layer are a flexible copper clad laminate (FCCL).

In an embodiment of the present disclosure, one of the electrical conducting layers is a signal transmission layer, and the other of the electrical conducting layers is an Electromagnetic Interference (EMI) shielding layer.

In an embodiment of the present disclosure, the flexible circuit board includes a plurality of electrical conducting layers. The electrical conducting layers are divided into a plurality of signal transmission layers and a plurality of grounding layers, and the flexible circuit board further includes at least one conductive hole electrically connected between the grounding layers.

In an embodiment of the present disclosure, the signal transmission layer and the grounding layer that are on the same layer form at least one signal transmission path and a plurality of grounding paths, and the lateral sides or the two opposite sides of the signal transmission path are provided with the grounding paths or the conductive hole.

In an embodiment of the present disclosure, the flexible circuit board includes a plurality of conductive holes, and the spacing between the mutually adjacent conductive holes is less than or equal to 2 mm.

In an embodiment of the present disclosure, the electrical conducting layers includes a plurality of signal transmission layers, a plurality of grounding layers and an EMI shielding layer, the EMI shielding layer is electrically connected to at least a part of the grounding layers, and the EMI shielding layer covers at least a part of the non-electrical conducting layers.

In an embodiment of the present disclosure, the EMI shielding layer completely covers the non-electrical conducting layers.

Based on the above, the flexible circuit board is formed by adhering at least two non-electrical conducting layers via an adhesion layer, which constitutes a main structure and is used for separating at least two electrical conducting layers. At the same time, the total thickness of the at least two non-electrical conducting layers is greater than 4 mil, and there is no electrical conducting layer sandwiched between the at least two non-electrical conducting layers. In this way, the stacked non-electrical conducting layers are used to increase the thickness of the flexible circuit board to reduce the loss during signal transmission, such that the flexible circuit board is sufficient to meet the transmission requirements of high-frequency and high-speed signals and there is no need to change the individual thickness of the existing laminate composition, thereby effectively avoiding an increase in manufacturing cost.

In order to make the aforementioned and other objectives and advantages of the present invention comprehensible, embodiments accompanied with figures are described in detail below.

DESCRIPTION OF THE EMBODIMENTS

Figure 1B:
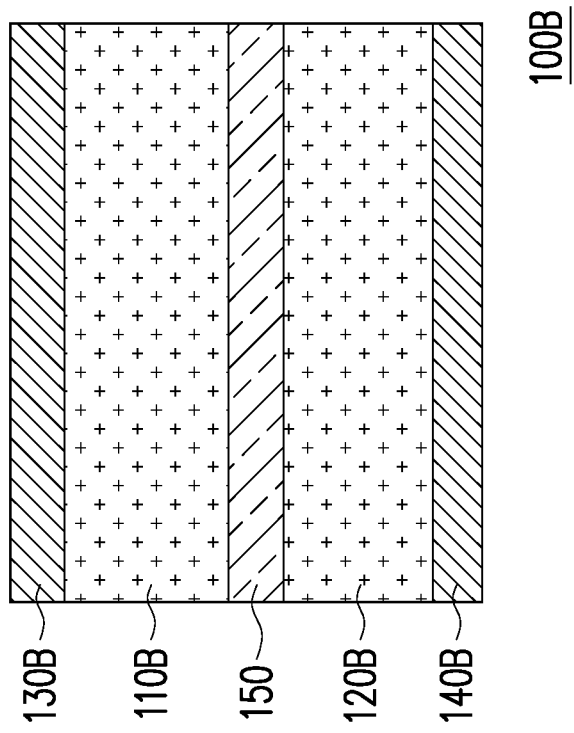
FIG. 1B, FIG. 1C and FIG. 1D are respectively cross-sectional views of a flexible circuit board according to different embodiments of the present disclosure.
Figure 1A:
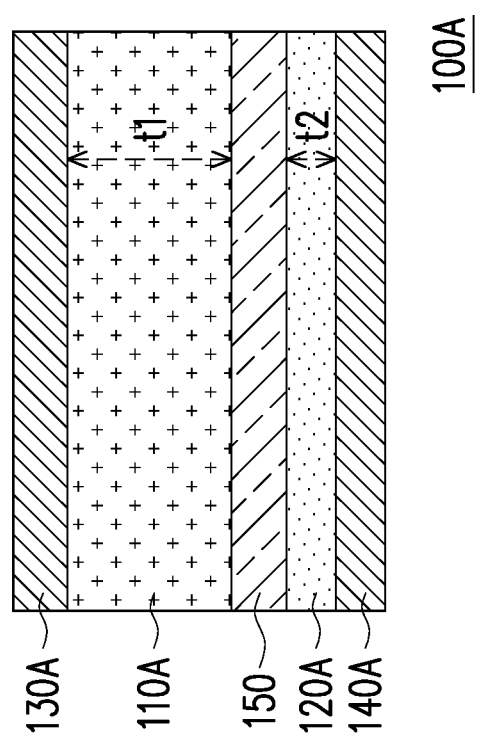
FIG. 1A is a cross-sectional view of a flexible circuit board according to an embodiment of the present disclosure.

FIG. 1A is a cross-sectional view of a flexible circuit board according to an embodiment of the present disclosure. Referring to FIG. 1A, in the present embodiment, the flexible circuit board 100A includes electrical conducting layers 130A, 140A, non-electrical conducting layers 110A, 120A, and an adhesion layer 150. The non-electrical conducting layers 110A, 120A are adhered together via the adhesion layer 150. The electrical conducting layers 130A, 140A are separated from each other by spacing of the non-electrical conducting layers 110A, 120A therebetween. It should be noted that the non-electrical conducting layers 110A, 120A belong to different materials. The non-electrical conducting layer 120A is polyimide (PI), and the non-electrical conducting layer 110A is liquid crystal polymer (LPP). The sum of thickness of the non-electrical conducting layers 110A, 120A is greater than 4 mil. In another embodiment, the non-electrical conducting layer can also be made into two layers by the same material.

In other words, in the present embodiment, the non-electrical conducting layer 110A and the electrical conducting layer 130A on the same side of the adhesion layer 150 are a flexible copper clad laminate (FCCL), and the non-electrical conducting layer 120A and the electrical conducting layer 140A located on the other same side of the adhesion layer 150 are another flexible copper clad laminate. The thickness t1 of the non-electrical conducting layer 110A is greater than the thickness t2 of the non-electrical conducting layer 120A. That is, the user adheres the two flexible copper clad laminates via the adhesion layer 150 to increase the relative distance between the electrical conducting layers 130A, 140A and enhance the impedance of the flexible circuit board 100A, thereby reducing the loss during signal transmission.

Further, due to the limitation of material characteristics of the non-electrical conducting layer, i.e., when the non-electrical conducting layer reaches a certain thickness or more, it will cause difficulty in controlling the uniformity during fabrication, and will also reduce the flexibility (softness) of the overall structure, for a single non-electrical conducting layer of the prior art, the thickness is mostly no more than 4 mil. In other words, on the premise that it is not easy to obtain a desired thickness by a single material and a single layer in the prior art, the present embodiment combines the different non-electrical conducting layers 110A, 120A only through the adhesion layer 150 such that there is no electrical conducting layer sandwiched between the non-electrical conducting layers 110A, 120A, thereby actually solving the above problems. In the present embodiment, the non-electrical conducting layers 110A and 120A are made of different materials, and in the fabrication, the combination can be completed by the adhesion layer 150 after each of the flexible copper clad laminates is completed.

Figure 1D:
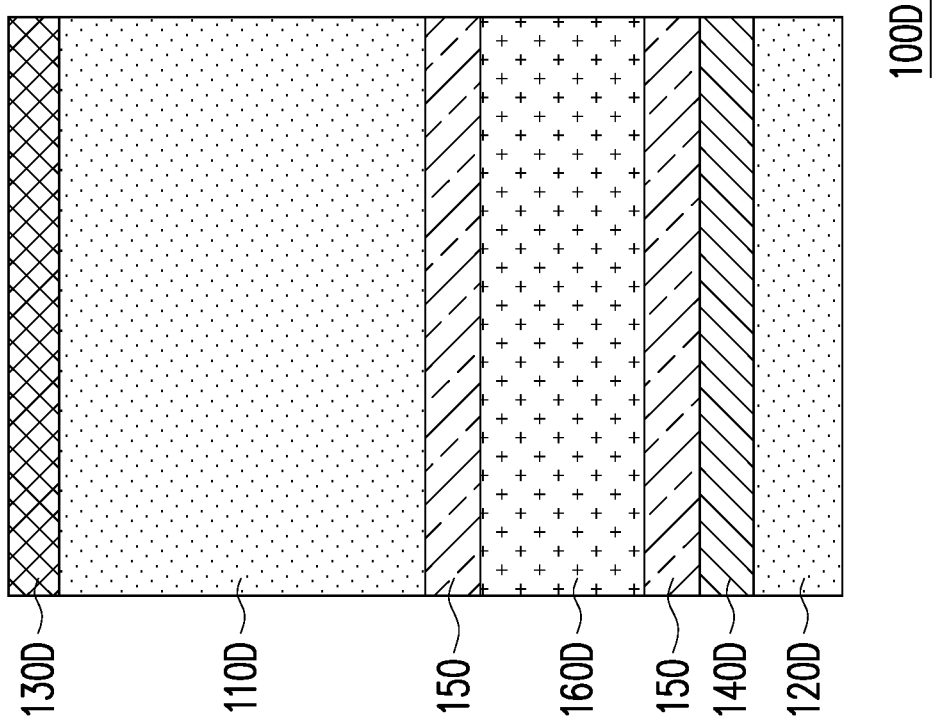
Figure 1C:
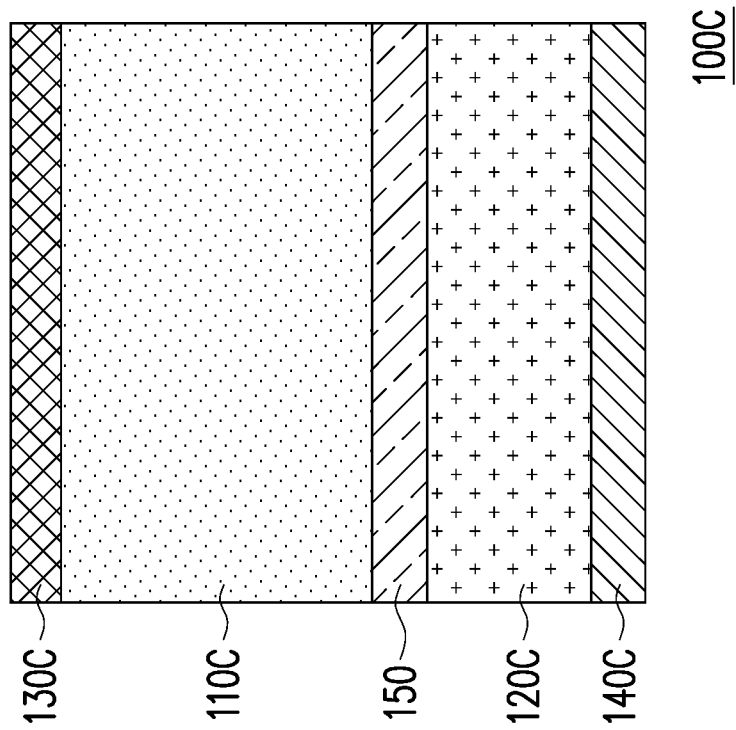

FIG. 1B, FIG. 1C and FIG. 1D are respectively cross-sectional views of a flexible circuit board according to different embodiments of the present disclosure. Referring first to FIG. 1B, the flexible circuit board 100B of the present embodiment includes non-electrical conducting layers 110B, 120B, electrical conducting layers 130B, 140B, and an adhesion layer 150. The electrical conducting layers 130B, 140B and the adhesion layer 150 are the same as the electrical conducting layers 130A, 140A and the adhesion layer 150 described above, except that the non-electrical conducting layers 110B, 120B of the present embodiment are made of a liquid crystal polymer. That is, the flexible circuit board 100B is formed by firstly forming the electrical conducting layers 130B, 140B at the non-electrical conducting layers 110b, 120B respectively and then combining them together via the adhesion layer 150. Similarly, the sum of thickness of the non-electrical conducting layers 110B, 120B of the present embodiment is also greater than 4 mil.

Referring to FIG. 1C, the flexible circuit board 100C of the present embodiment includes non-electrical conducting layers 110C, 120C, electrical conducting layers 130C, 140C, and an adhesion layer 150. The electrical conducting layers 130C, 140C and the adhesion layer 150 are the same as in the foregoing embodiment, and the non-electrical conducting layer 120C is also made of a liquid crystal polymer, except that the non-electrical conducting layer 110C of the present embodiment is made of a polyimide stiffener (PI stiffener). The non-electrical conducting layer 110C may be a single-layer polyimide stiffener or a stack of multiple layers of polyimide stiffeners herein. It should also be mentioned that the electrical conducting layer 140C is the signal transmission layer or the grounding layer of the flexible circuit board 100C, and the electrical conducting layer 130C is the Electromagnetic Interference (EMI) shielding layer of the flexible circuit board 100C to avoid interference during signal transmission.

Referring to FIG. 1D, the flexible circuit board 100D of the present embodiment includes non-electrical conducting layers 110D, 120D, 160D, electrical conducting layers 130D, 140D, and an adhesion layer 150. The electrical conducting layers 130D, 140D, the adhesion layer 150, and the non-electrical conducting layers 110D, 140D are the same as in the embodiment shown in FIG. 1C. The difference is that the flexible circuit board 100D of the present embodiment further combines the non-electrical conducting layer 110D and the electrical conducting layer 140D via the non-electrical conducting layer 160D and the adhesion layer 150. That is, in the present embodiment, two sets of flexible copper clad laminates (non-electrical conducting layer 110D and electrical conducting layer 130D, non-electrical conducting layer 120D and electrical conducting layer 140D) are completed first, and then the non-electrical conducting layer 160D and the adhesion layer 150 are adhered therebetween, thereby increasing the thickness of the flexible circuit board 100D by a lamination means. As described above, the impedance of the flexible circuit board 100A can be enhanced by increasing the total thickness of the non-electrical conducting layer to reduce the loss during signal transmission. It can be further known from the flexible circuit boards 100A-100D of the above embodiments that the sum of thickness of the non-electrical conducting layers can be increased by a stacking means to achieve the desired impedance, and even the number of the non-electrical conducting layers is greater than or equal to the number of the electrical conducting layers.

On the other hand, it can be known from the above embodiments that the non-electrical conducting layer to be stacked in the present disclosure includes at least two of polyimide, modified polyimide, polyimide stiffener and liquid crystal polymer. The flexible circuit board that meets the required electrical conditions is further formed by properly combining different materials based on their electrical characteristics.

Figure 2A:
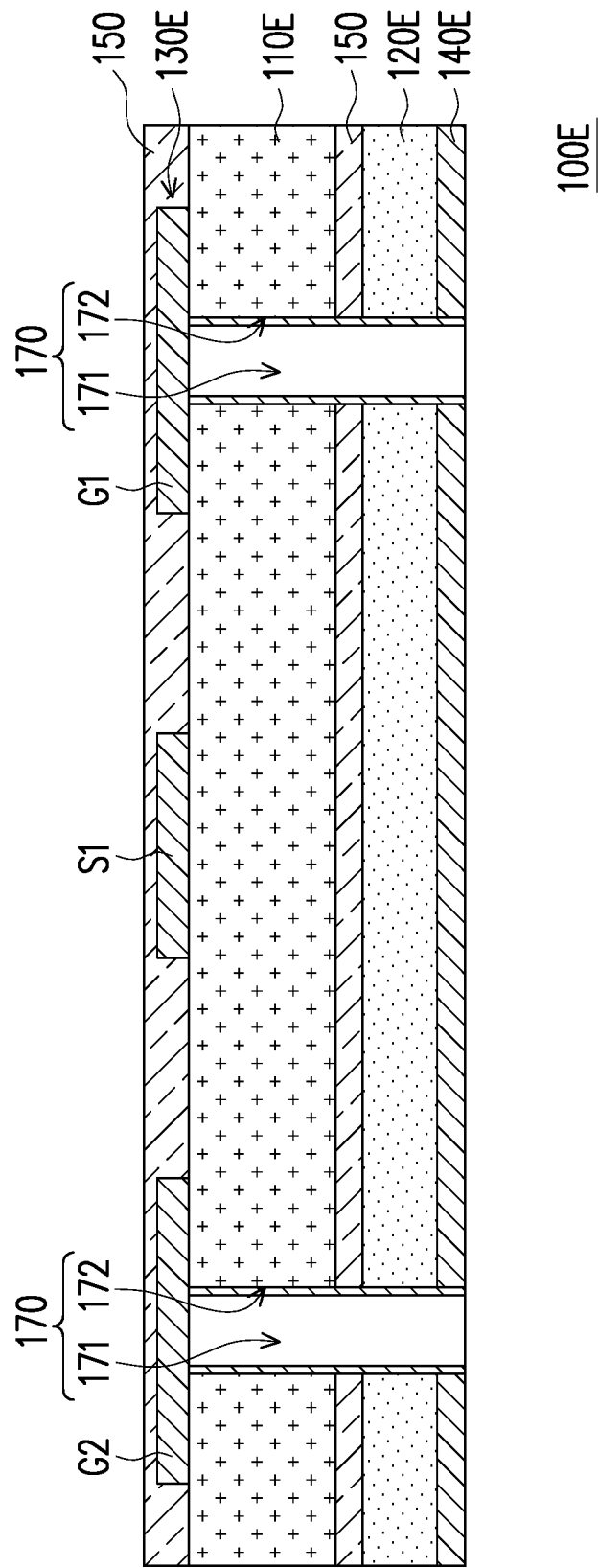
FIG. 2A and FIG. 2B are cross-sectional views of a flexible circuit board according to different embodiments of the present disclosure.
Figure 2B:
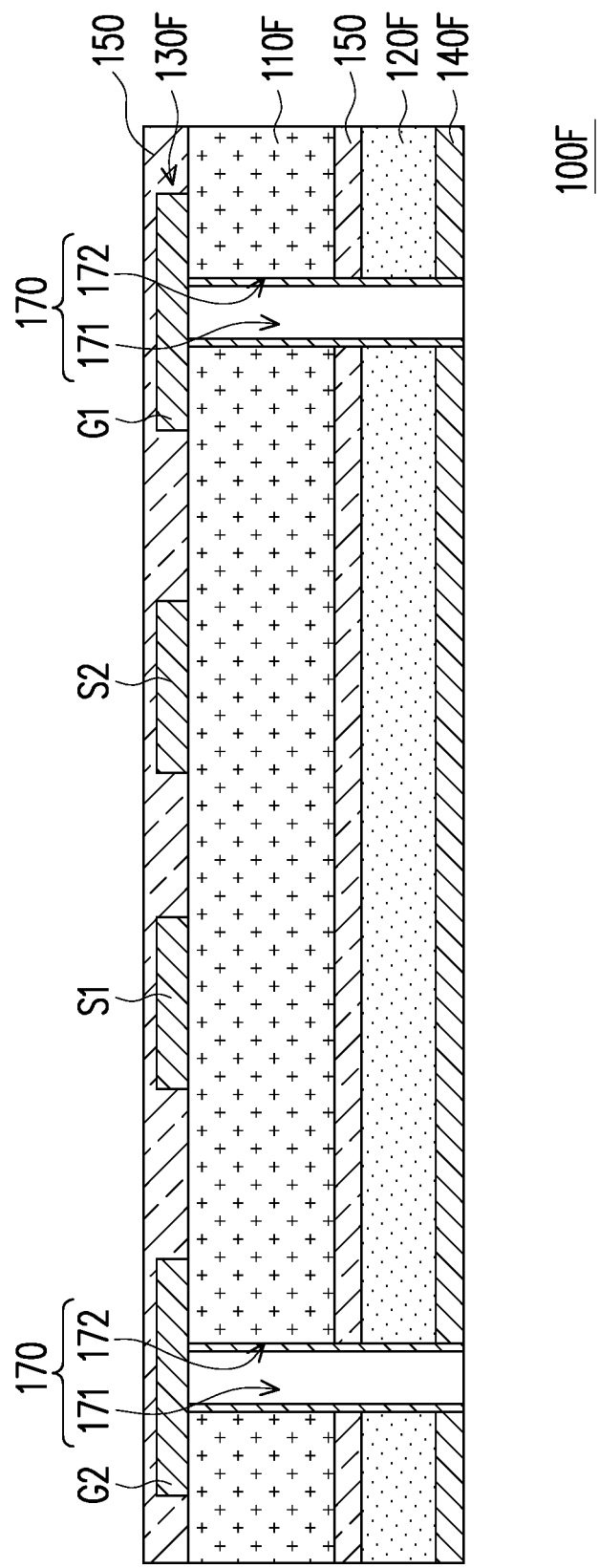

FIG. 2A and FIG. 2B are cross-sectional views of a flexible circuit board according to different embodiments of the present disclosure. Referring first to FIG. 2A, the flexible circuit board 100E of the present embodiment includes non-electrical conducting layers 110E, 120E, electrical conducting layers 130E, 140E, and an adhesion layer 150. The non-electrical conducting layers 110E, 120E are the same as the non-electrical conducting layers described above, and may be selected from related materials depending on the required electrical characteristics, and the descriptions thereof are omitted herein. It should be noted that the electrical conducting layer 130E includes two parts, one part is a signal transmission layer, and the other part is a grounding layer, and the electrical conducting layer 140E is a grounding layer. In other words, in the present embodiment, the same electrical conducting layer 130E can further form a signal transmission path S1 and a plurality of grounding paths G1, G2. Furthermore, the flexible circuit board 100E further includes a conductive hole 170 which is structurally machined by forming a through hole 171 by laser or mechanically and forming an electrical conducting layer 172 on the wall of the hole, thereby being electrically connected between the grounding paths G1, G2 of the electrical conducting layer 130E and the electrical conducting layer 140E as the grounding.

In addition, the conductive holes 170 are distributed beside the signal transmission path S1 or on two opposite sides thereof to provide a shielding effect and effectively reduce crosstalk interference.

Referring to FIG. 2B, the flexible circuit board 100F includes non-electrical conducting layers 110F, 120F, electrical conducting layers 130F, 140F, and an adhesion layer 150 and a conductive hole 170. The structural composition is the same as that of the embodiment shown in FIG. 2A, and the descriptions thereof are omitted herein. Different from the above, in the present embodiment, in the same electrical conducting layer 130F, a pair of differential signal transmission paths S1, S2 are formed between the pair of grounding paths G1, G2 such that the pair of signal transmission paths S1, S2 are disposed between the conductive holes 170. In this case, when the signal transmission paths S1, S2 are used to transmit the differential high-speed signal, shielding by the conductive holes 170 on the two sides can be further realized, and the spacing of the conductive holes 170 is less than or equal to 2 mm to improve the shielding effect. In particular, when the plurality of conductive holes 170 are arranged in the direction of the entrance and exit of the drawing, a grid-like shield can be further formed to effectively reduce crosstalk interference.

Figure 3A:
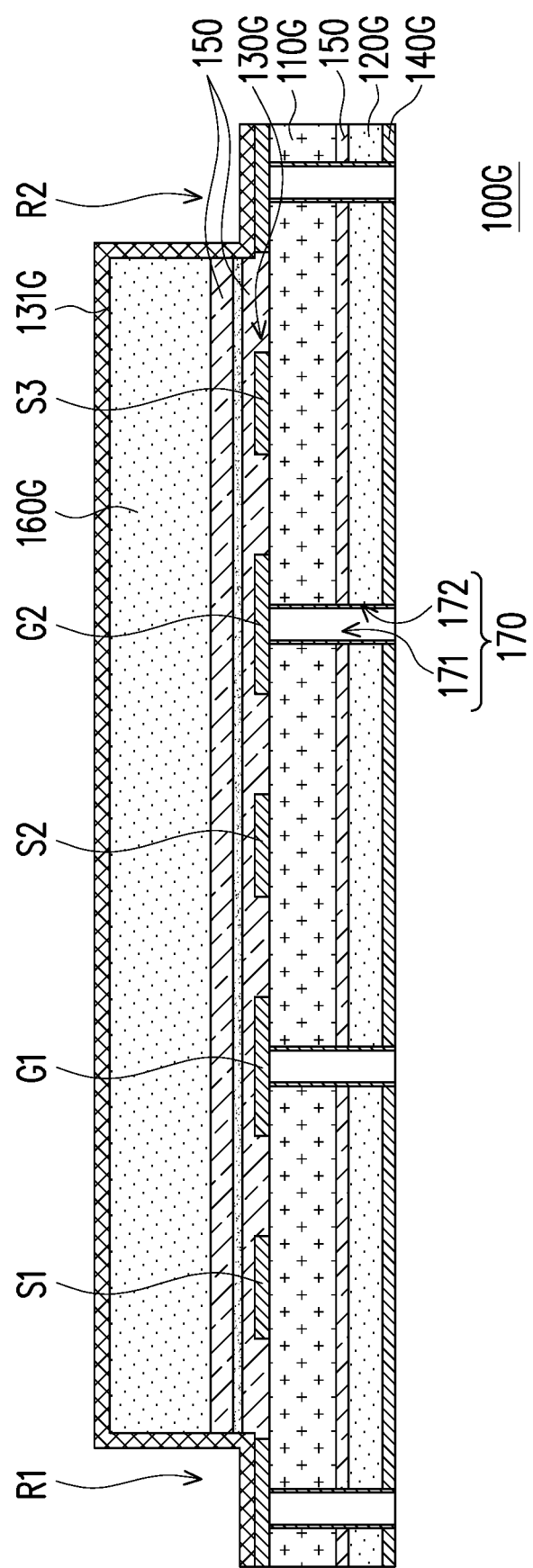
FIG. 3A and FIG. 3B are cross-sectional views of a flexible circuit board according to different embodiments of the present disclosure.
Figure 3B:
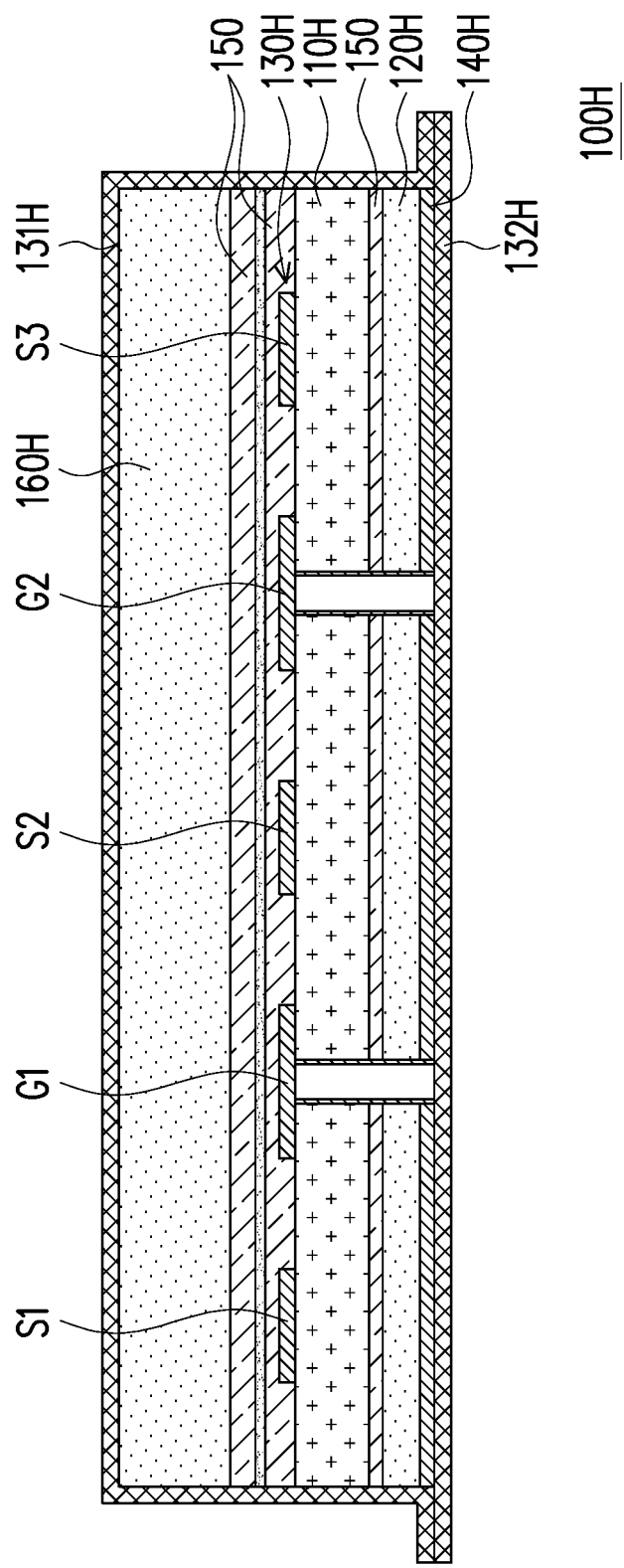

FIG. 3A and FIG. 3B are cross-sectional views of a flexible circuit board according to different embodiments of the present disclosure. Referring first to FIG. 3A, the flexible circuit board 100G includes electrical conducting layers 130G, 140G, non-electrical conducting layers 110G, 120G, 160G, and an adhesion layer 150. In the drawing, the configuration of the adhesion layer 150 and the structure below is the same as in the foregoing embodiment, and the descriptions thereof are omitted herein. Similarly, the same electrical conducting layer 130G forms a plurality of signal transmission paths S1, S2 and S3 and grounding paths G1, G2, which are arranged in a staggered manner. The difference is that the present embodiment further includes an electrical conducting layer 131G as an EMI shielding layer disposed on the non-electrical conducting layer 160G and electrically connected to the electrical conducting layer 130G along recessed structures R1, R2 on the two sides thereof. That is, structurally, the EMI shielding layer shields a portion of the non-electrical conducting layer to provide the desired EMI shielding effect. The detailed contours of the recessed structures R1, R2 are not limited here, and in other embodiments not shown, they may also be an open-hole structure having a larger diameter.

Referring to FIG. 3B, the flexible circuit board 100H includes electrical conducting layers 130H, 140H, non-electrical conducting layers 110H, 120H, 160H, and an adhesion layer 150. In contrast to FIG. 3A, in the present embodiment, the electrical conducting layers 131H, 132H are used as EMI shielding layers, and completely cover the outside of the structure. That is, the non-electrical conducting layers are completely covered by the electrical conducting layers 131H, 132H to avoid the possibility of electromagnetic interference, and the rest are described as in the above embodiments, and the descriptions thereof are omitted herein.

Figure 4A:
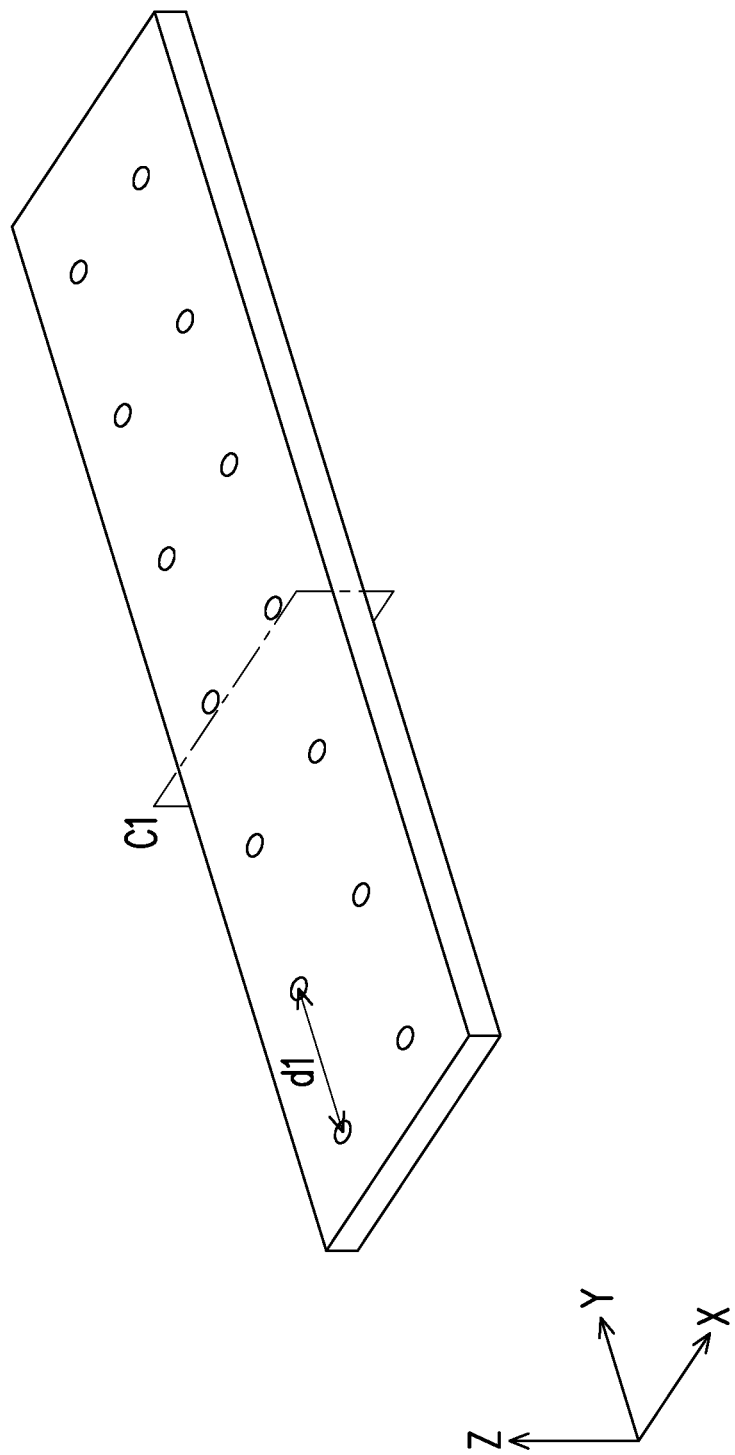
FIG. 4A is a schematic view of a flexible circuit board in the prior art.
Figure 4B:
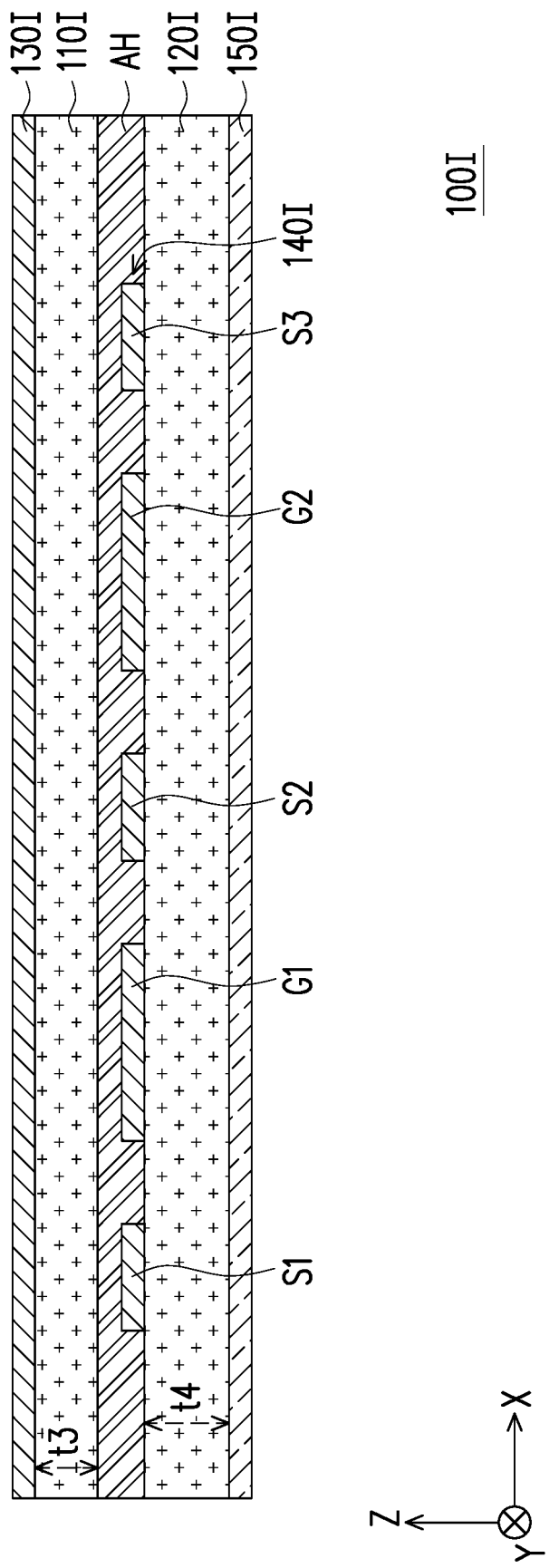
FIG. 4B is a cross-sectional view of the flexible circuit board of FIG. 4A on plane C1.

FIG. 4A is a schematic view of a flexible circuit board in the prior art. FIG. 4B is a cross-sectional view of the flexible circuit board of FIG. 4A on plane C1. FIG. 4C to FIG. 4G are related characteristic diagrams for signal integrity of the flexible circuit board of FIG. 4A. Referring to FIG. 4A and FIG. 4B, in combination with FIG. 4C to FIG. 4G, in FIG. 4A and FIG. 4B, the flexible circuit board 100I is formed by a maximum laminated state of single mediums, the non-electrical conducting layers 110I, 120I are each provided with electrical conducting layers 130I, 150I, and the non-electrical conducting layers 110I, 120I are adhered together via the adhesion layer AH. An electrical conducting layer 140I is formed in the adhesion layer AH to serve as the transmission signal paths S1, S2, S3 and the grounding paths G1, G2, and according to the prior art, the thicknesses t3, t4 of the non-electrical conducting layers 110I, 120I each do not exceed 4 mil. Furthermore, the spacing d1 of the through holes is 3 mm. Accordingly, signal integrity (SI) simulation analysis is performed on the flexible circuit board 100I to produce corresponding results as shown in FIG. 4C to FIG. 4G.

Figure 4C:
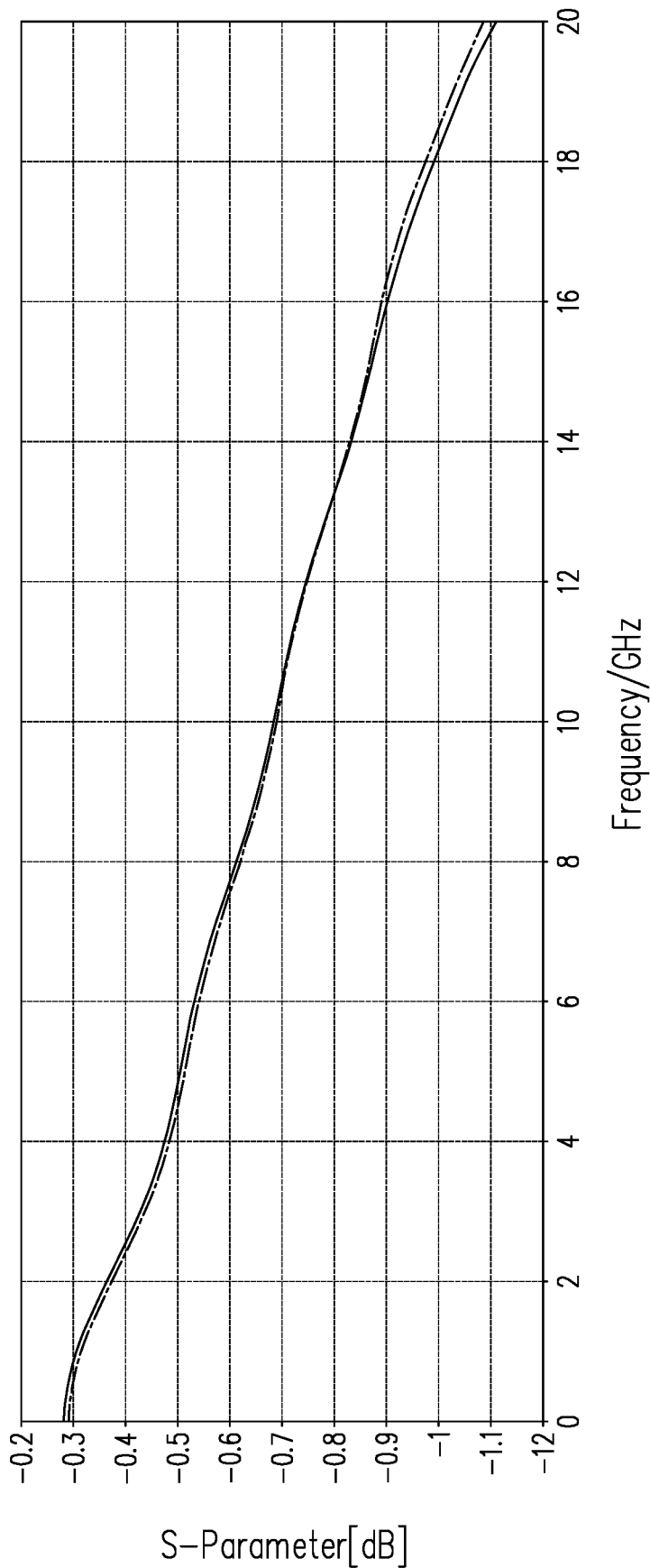
FIG. 4C to FIG. 4G are related characteristic diagrams for signal integrity of the flexible circuit board of FIG. 4A.
Figure 4D:
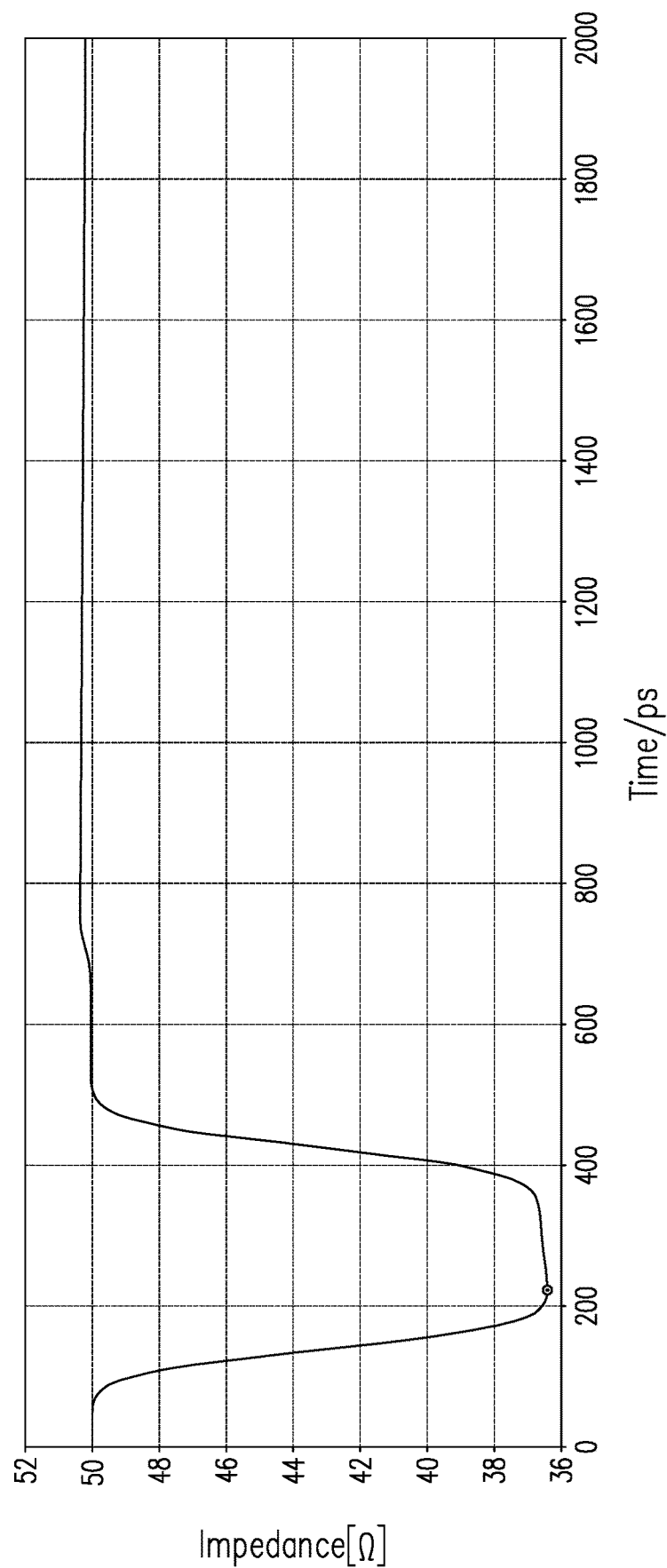
Figure 4E:
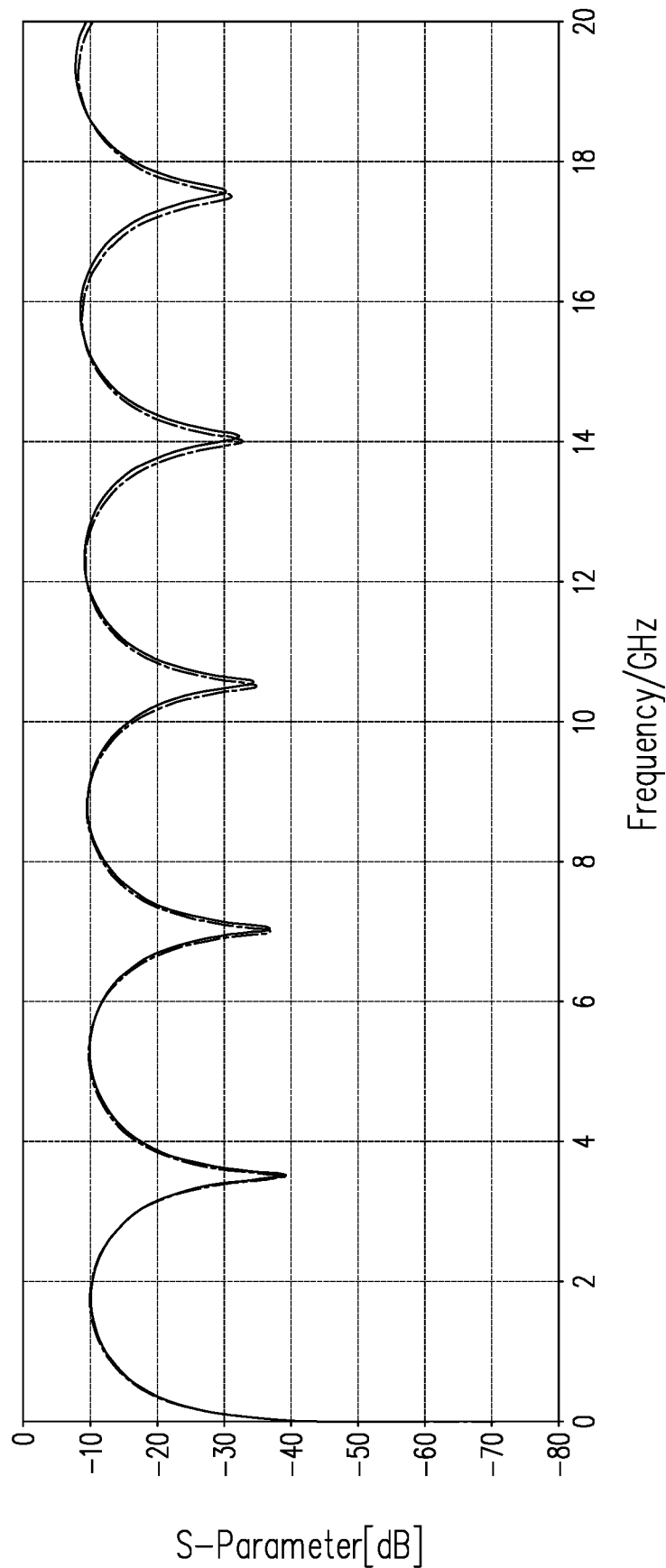
Figure 4F:
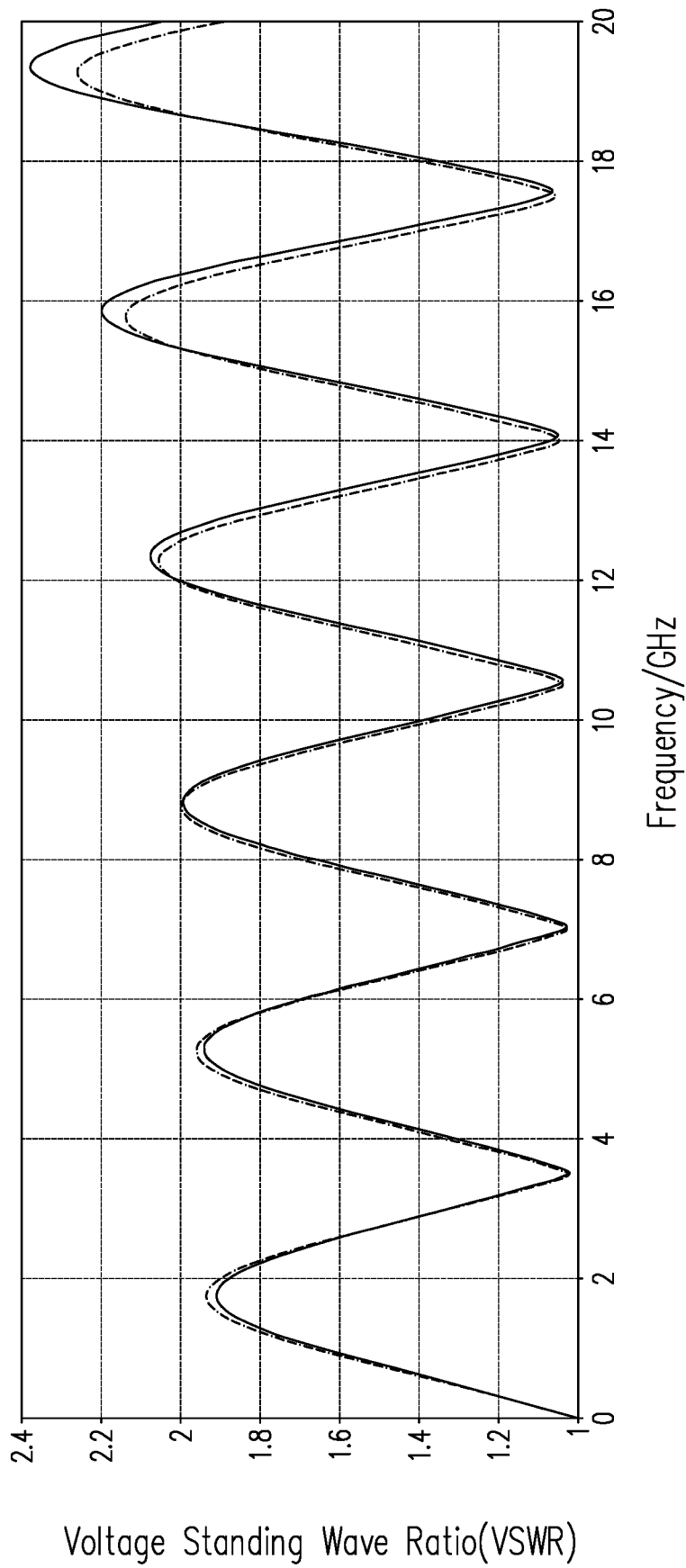
Figure 4G:
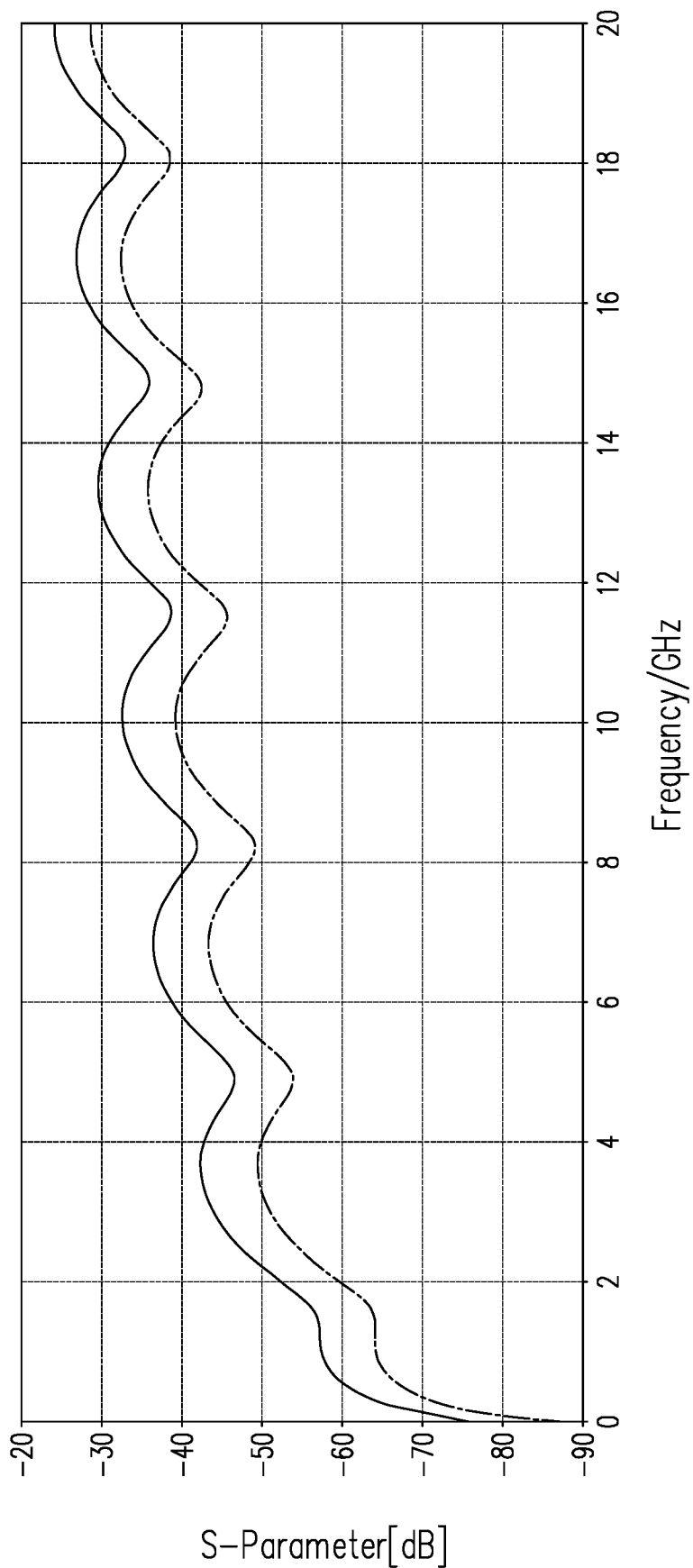

In FIG. 4C, it shows the insertion loss during the signal transmission of the flexible circuit board 100I, and the test result obtained therefrom has −0.54 dB at the frequency of 6 GHz and −0.69 dB at 10 GHz. In FIG. 4D, it shows the impedance of the flexible circuit board 100I, and the test result obtained therefrom has a lowest point (circled in the drawing) of 36.4Ω. In FIG. 4E, it shows the return loss during signal transmission, i.e., the signal return observed at the signal transmitting end, and the test result obtained therefrom has −12 dB at the frequency of 6 GHz and −16 dB at a frequency of 10 GHz. In FIG. 4F, it shows the voltage standing wave ratio (VSWR) of the flexible circuit board 100I to show the ratio of the voltage peak value of the formed standing wave to the voltage valley value, so as to know the impedance matching state. The simulation analysis result obtained therefrom has a ratio of 1.7 at a frequency of 6 GHz and a ratio of 1.4 at a frequency of 10 GHz. In FIG.

4G, it shows the near-end crosstalk (NEXT) of the flexible circuit board 100I with respect to the signal transmission path, and the test result obtained therefrom has −39 dB at a frequency of 6 GHz and −33 dB at a frequency of 10 GHz.

Figure 5A:
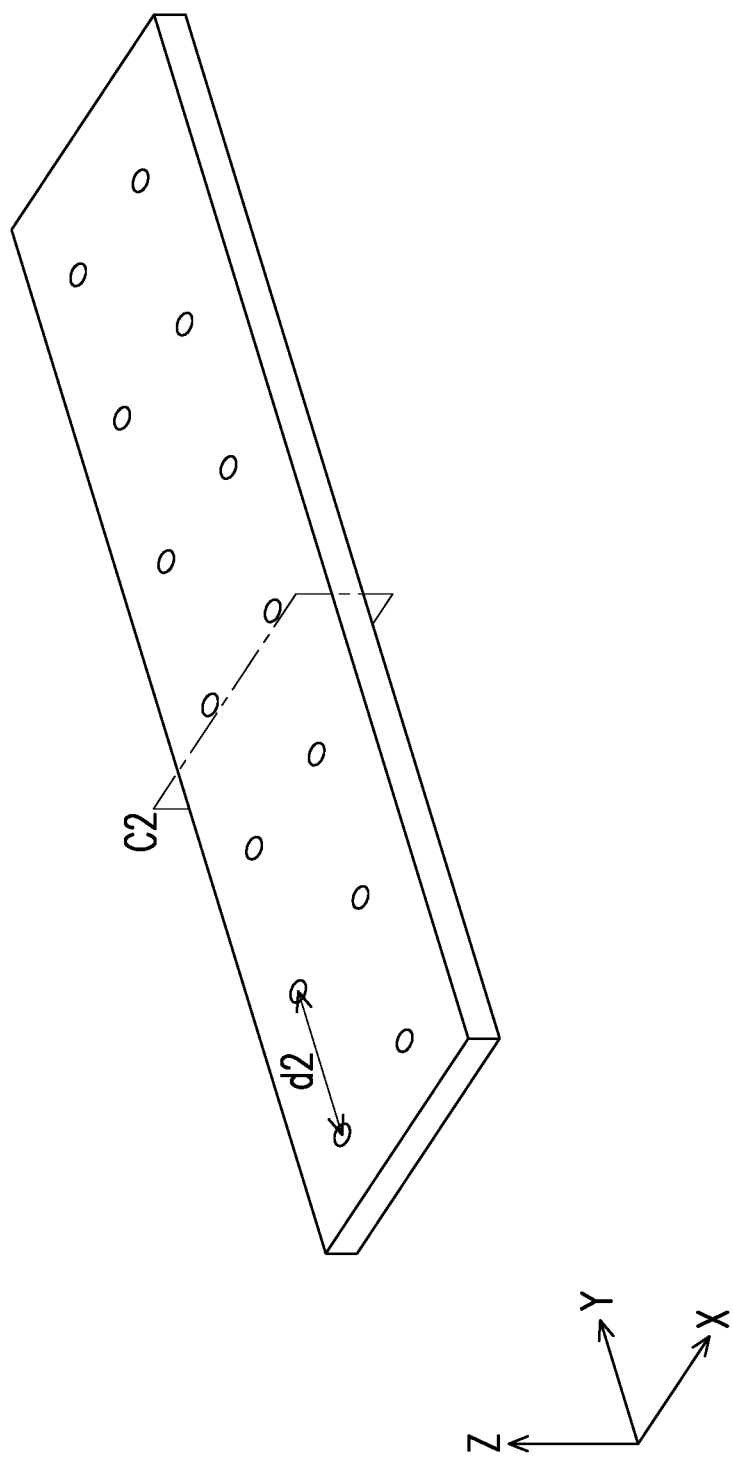
FIG. 5A is a schematic view of a flexible circuit board according to an embodiment of the present disclosure.
Figure 5B:
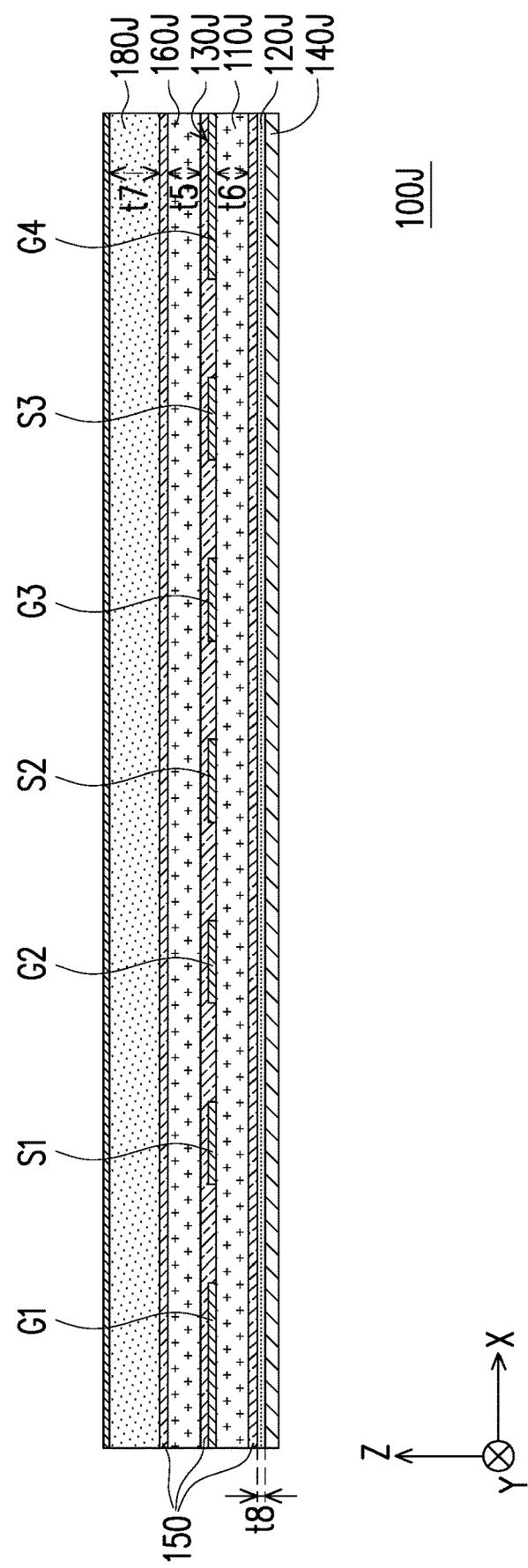
FIG. 5B is a cross-sectional view of the flexible circuit board of FIG. 5A on plane C2.

FIG. 5A is a schematic view of a flexible circuit board according to an embodiment of the present disclosure. FIG. 5B is a cross-sectional view of the flexible circuit board of FIG. 5A on plane C2. FIG. 5C to FIG. 5G are related characteristic diagrams for signal integrity of the flexible circuit board of FIG. 5A. Referring first to FIG. 5A, the flexible circuit board 100J of the present embodiment includes electrical conducting layers 130J, 140J, non-electrical conducting layers 180J, 160J, 110J and 120J, and an adhesion layer 150. In the non-electrical conducting layers 180J, 160J, 110J and 120J, the sum of the thicknesses t7 and t5 exceeds 4 mil, the sum of the thicknesses t6 and t8 exceeds 4 mil, and the spacing d2 of the conductive holes 170 is 1 mm. Accordingly, signal integrity (SI) simulation analysis is performed to produce corresponding results as shown in FIG. 5C to FIG. 5G.

Figure 5C:
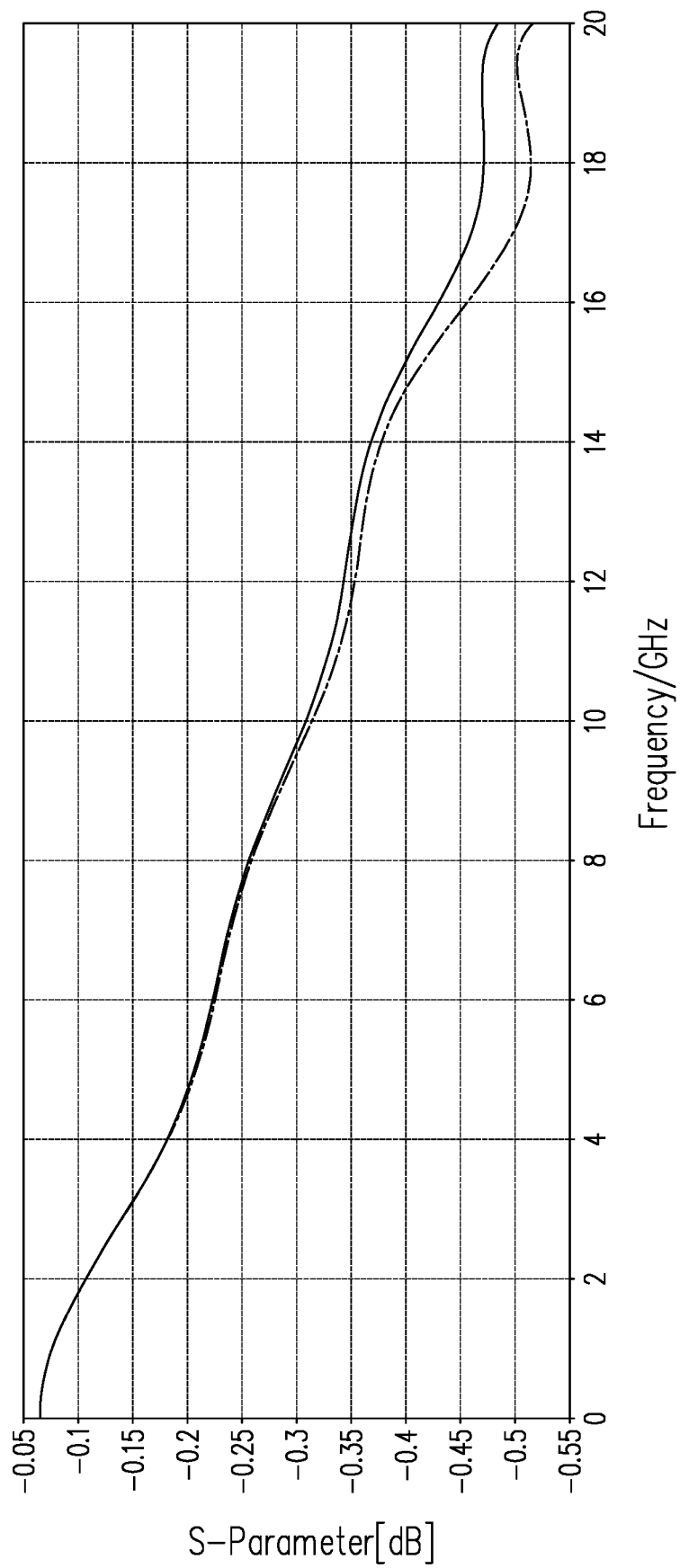
FIG. 5C to FIG. 5G are related characteristic diagrams for signal integrity of the flexible circuit board of FIG. 5A.
Figure 5D:
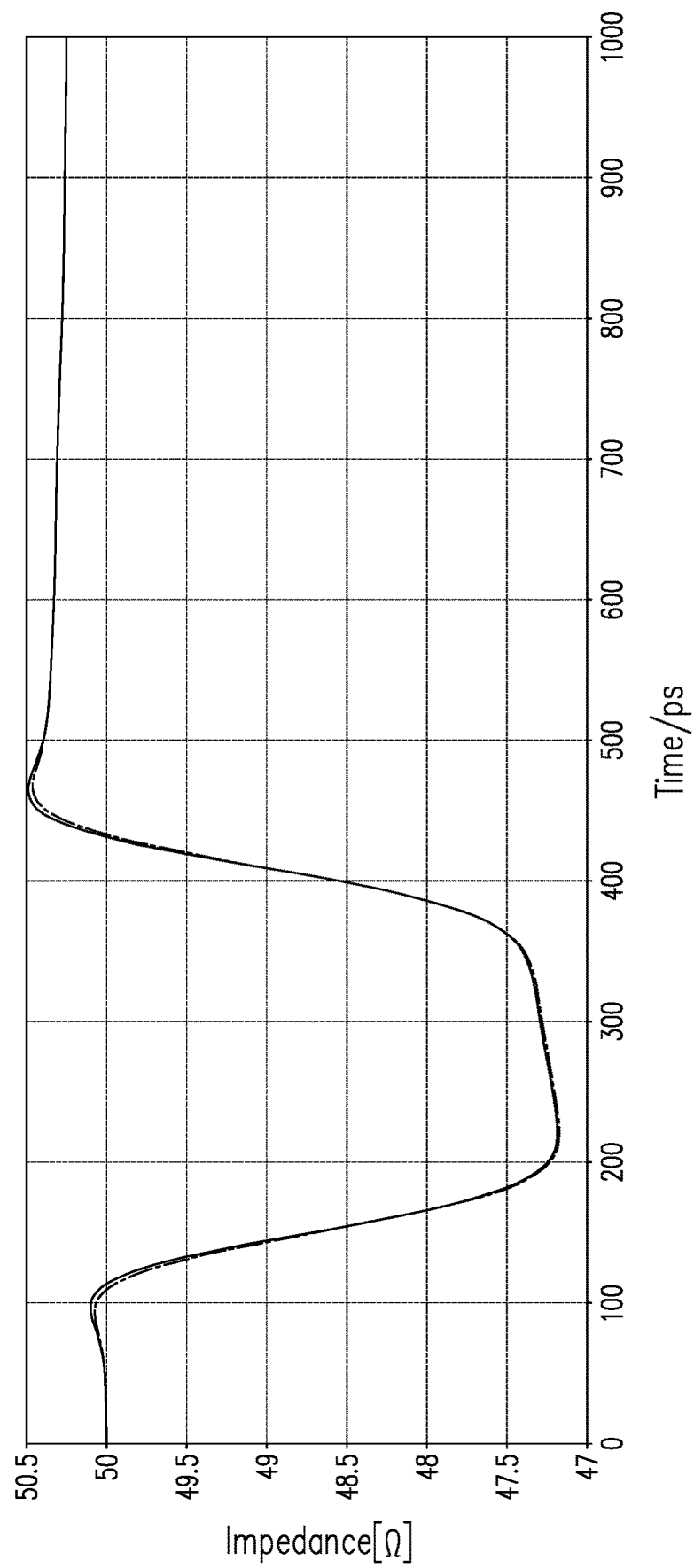
Figure 5E:
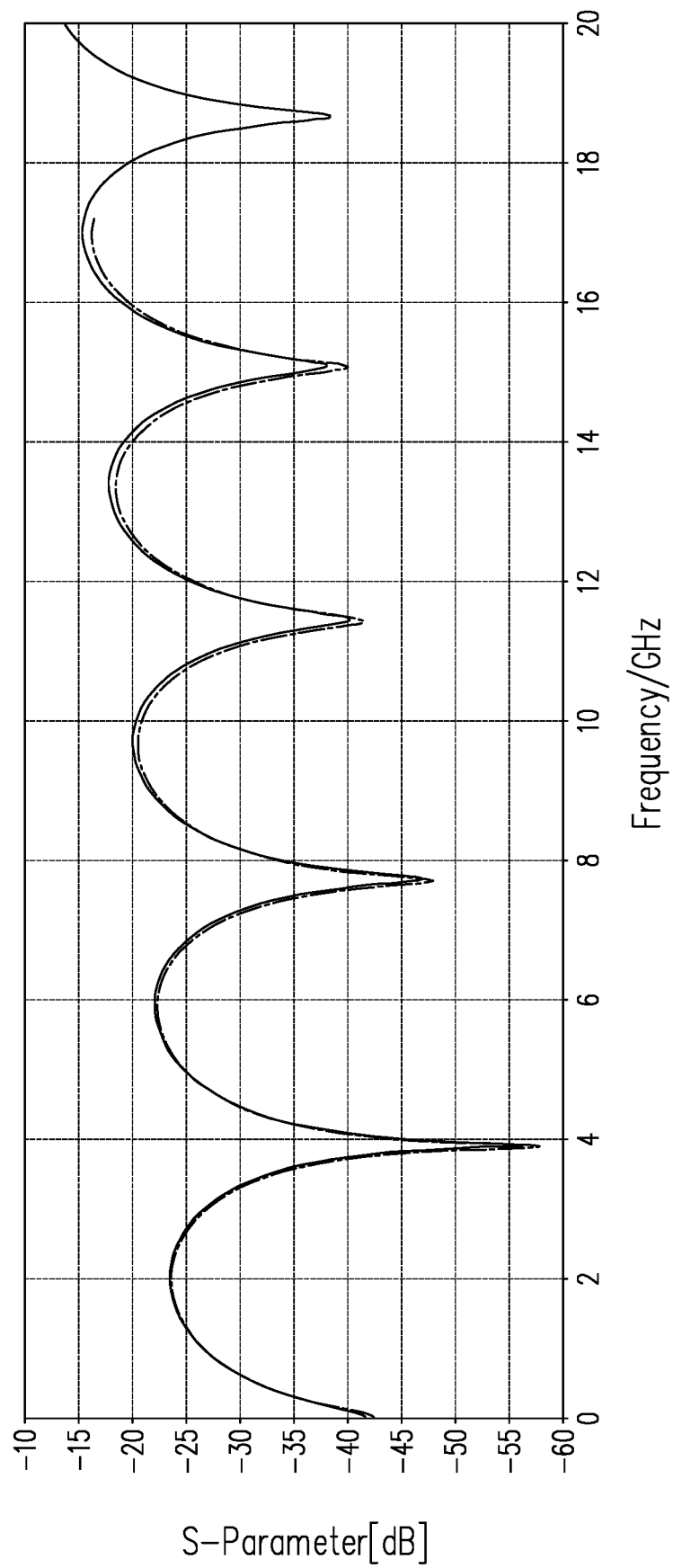
Figure 5F:
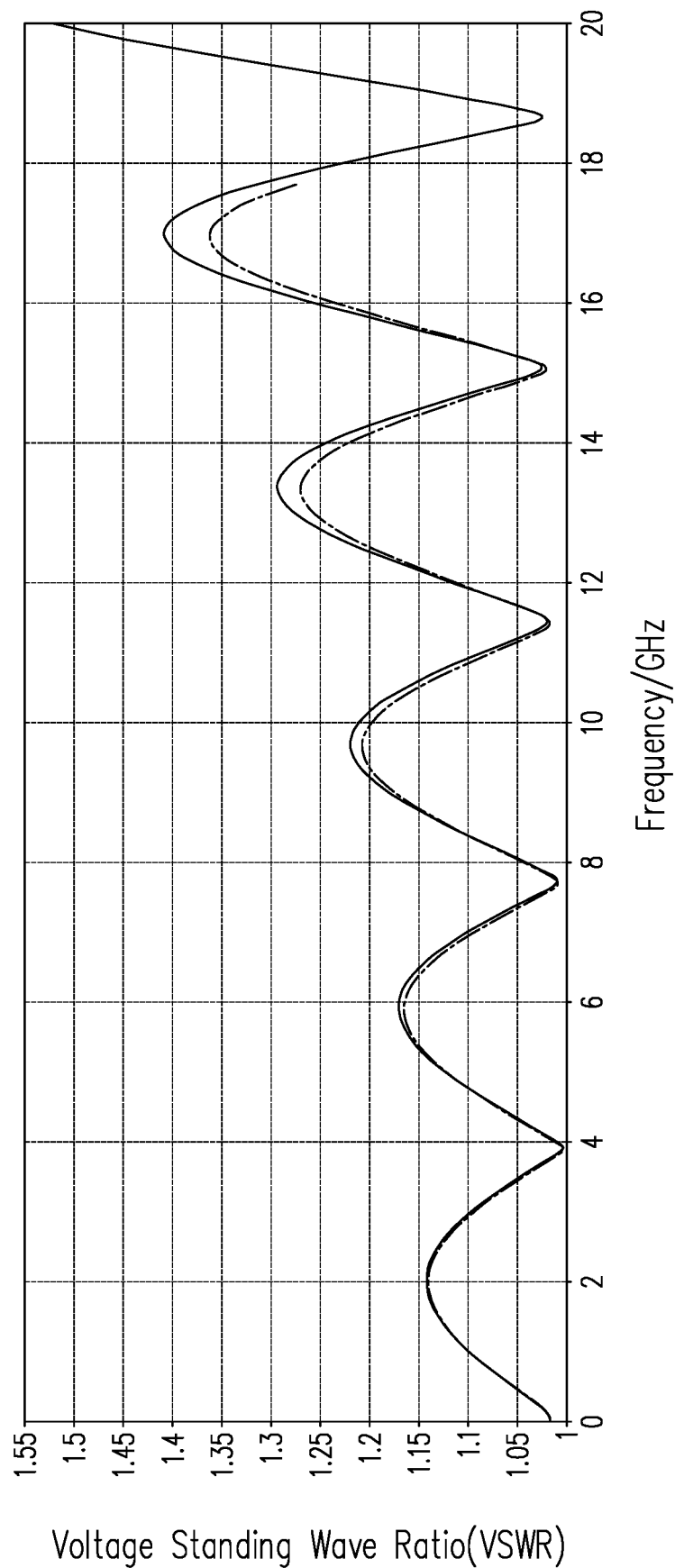
Figure 5G:
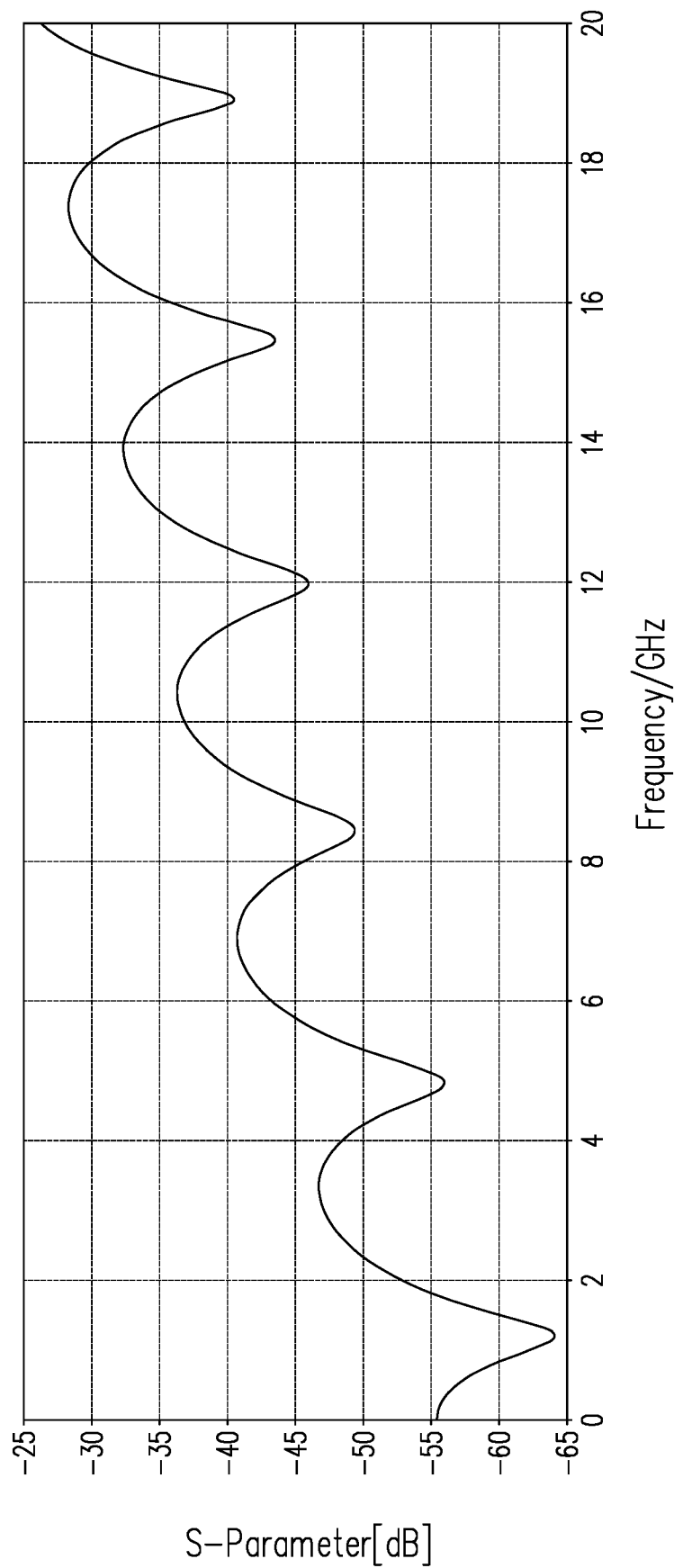

Next, referring to FIG. 5C to FIG. 5G, in combination with FIG. 4C to FIG. 4G, the simulation analysis result obtained from FIG. 5C has −0.23 dB at a frequency of 6 GHz and −0.32 dB at a frequency of 10 GHz, which is significantly better than that shown in FIG. 4C. Test result obtained from FIG. 5D has the lowest point of 47.2Ω, which has significantly improved the impedance compared to that shown in FIG. 4D. The test result obtained from FIG. 5E has −22 dB at a frequency of 6 GHz and −21 dB at a frequency of 10 GHz, indicating that its return loss has been further reduced compared to FIG. 4E. The test result obtained from FIG. 5F has a ratio of 1.17 at a frequency of 6 GHz and a ratio of 1.21 at a frequency of 10 GHz, which has been further reduced compared to FIG. 4F. The test result obtained from FIG. 5G has −43 dB at a frequency of 6 GHz and −37 dB at a frequency of 10 GHz, so that the spacing d2 of the conductive holes 170 of the flexible circuit board 100J is reduced and the near-end crosstalk can be smoothly improved, which is significantly better than that shown in FIG. 4G.

Based on the above, the preliminary results have shown that the structural configuration of the flexible circuit board 100J shown in FIG. 5A and FIG. 5B has improved signal transmission characteristics as compared with the flexible circuit board 100I as shown in FIG. 4A and FIG. 4B.

Based on the above, in the above embodiments of the present disclosure, the flexible circuit board is formed by mutually adhering at least two non-electrical conducting layers only via the adhesion layer, which constitutes the main structure and is used to separate the at least two electrical conducting layers. That is, there is no electrical conducting layer sandwiched between the non-electrical conducting layers and the total thickness of the at least two non-electrical conducting layers is greater than 4 mil. Furthermore, the non-electrical conducting layer can be selected according to the electrical characteristics of different materials, for example, from polyimide, modified polyimide, polyimide stiffener and liquid crystal polymer, so as to be adapted to the signal transmission conditions of the applied products. Furthermore, in addition to being a signal transmission path and a grounding path, the electrical conducting layer can be further additionally provided to provide an EMI shielding effect, and can partially or completely cover the non-electrical conducting layer depending on the desired effect. In addition, the grounding paths or the conductive hole electrically connected therewith are disposed beside the signal transmission path or the two opposite sides thereof to avoid crosstalk interference.

In this way, the stacked non-electrical conducting layers are used to increase the thickness of the flexible circuit board and further to reduce the loss during signal transmission by matching with various above structures, such that the flexible circuit board is sufficient to meet the transmission requirements of high-frequency and high-speed signals and there is no need to change the individual thickness of the existing laminate composition, thereby effectively avoiding an increase in manufacturing cost.

Although the present invention is disclosed with reference to embodiments above, the embodiments are not intended to limit the present invention. Any person of ordinary skill in the art may make some variations and modifications without departing from the spirit and scope of the present invention, and therefore, the protection scope of the present invention should be defined in the following claims.

What is claimed is:

1. A flexible circuit board, comprising:
   at least two electrical conducting layers;
   at least two non-electrical conducting layers, disposed between the at least two electrical conducting layers; and
   at least one adhesion layer, the at least two non-electrical conducting layers being adhered together via the at least one adhesion layer, wherein a sum of thickness of the at least two non-electrical conducting layers is greater than 4 mil, and there is no electrical conducting layer sandwiched between the at least two non-electrical conducting layers,
   wherein one of the electrical conducting layers is a signal transmission layer, and the other of the electrical conducting layers is an Electromagnetic Interference (EMI) shielding layer.

2. The flexible circuit board according to claim 1, wherein the at least two non-electrical conducting layers comprise at least one material.

3. The flexible circuit board according to claim 1, wherein the at least two non-electrical conducting layers comprise at least one of polyimide (PI), modified polyimide (modified PI), polyimide stiffener (PI stiffener) and liquid crystal polymer (LCP).

4. The flexible circuit board according to claim 1, wherein the electrical conducting layer and the non-electrical conducting layer located on the same side of the adhesive layer are a flexible copper clad laminate (FCCL).

5. The flexible circuit board according to claim 1, wherein the number of the at least two non-electrical conducting layers is greater than or equal to the number of the at least two electrical conducting layers.

6. The flexible circuit board according to claim 1, comprising a plurality of electrical conducting layers, wherein the electrical conducting layers are divided into a plurality of signal transmission layers and a plurality of grounding layers, and the flexible circuit board further comprises at least one conductive hole electrically connected between the grounding layers.

7. The flexible circuit board according to claim 6, wherein the signal transmission layer and the grounding layers that are on the same layer form at least one signal transmission path and a plurality of grounding paths, and the lateral sides or the two opposite sides of the at least one signal transmission path are provided with the grounding paths or the at least one conductive hole.

8. The flexible circuit board according to claim 1, comprising a plurality of conductive holes, wherein the spacing between the mutually adjacent conductive holes is less than or equal to 2 mm.

9. A flexible circuit board, comprising:
- at least two electrical conducting layers;
- at least two non-electrical conducting layers, disposed between the at least two electrical conducting layers; and
- at least one adhesion layer, the at least two non-electrical conducting layers being adhered together via the at least one adhesion layer, wherein a sum of thickness of the at least two non-electrical conducting layers is greater than 4 mil, and there is no electrical conducting layer sandwiched between the at least two non-electrical conducting layers,
- wherein the at least two electrical conducting layers comprise a plurality of signal transmission layers, a plurality of grounding layers and an Electromagnetic Interference (EMI) shielding layer, the EMI shielding layer is electrically connected to at least a part of the grounding layers, and the EMI shielding layer covers at least a part of the at least two non-electrical conducting layers.

10. The flexible circuit board according to claim 9, wherein the EMI shielding layer completely covers the at least two non-electrical conducting layers.

* * * * *